(12) United States Patent
Kim (10) Patent No.: US 8,487,363 B2
(45) Date of Patent: Jul. 16, 2013

(54) METHOD FOR MANUFACTURING SEMICONDUCTOR DEVICE

(75) Inventor: Sung Hyun Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 67 days.

(21) Appl. No.: 13/305,463

(22) Filed: Nov. 28, 2011

(65) Prior Publication Data
US 2012/0068232 A1 Mar. 22, 2012

Related U.S. Application Data

(62) Division of application No. 12/495,723, filed on Jun. 30, 2009, now Pat. No. 8,084,326.

(30) Foreign Application Priority Data

Sep. 9, 2008 (KR) .................. 10-2008-0088764

(51) Int. Cl.
*H01L 29/78* (2006.01)

(52) U.S. Cl.
USPC ............ 257/306; 257/E29.264; 257/E21.421; 438/241; 438/253

(58) Field of Classification Search
USPC ................. 257/296, 297, 306–309, 750, 753, 257/754, E21.159, E21.421, E21.422, E29.264; 438/241, 253–256, 259, 618–621, 629, 675
See application file for complete search history.

(56) References Cited

U.S. PATENT DOCUMENTS

2008/0266927 A1* 10/2008 Lee et al. .................. 365/63

* cited by examiner

*Primary Examiner* — Julio J Maldonado
*Assistant Examiner* — Daniel Shook (57) ABSTRACT

The present invention relates to a method for manufacturing a semiconductor device, and provides to reduce a contact resistance of a landing plug by forming the landing plug in such a manner that a polysilicon layer is deposited only on the surface of a landing plug contact hole, and a metal layer is buried in the rest of the landing plug contact hole in the process of forming a storage node contact or a bit line contact.

8 Claims, 8 Drawing Sheets

METHOD FOR MANUFACTURING SEMICONDUCTOR DEVICE

CROSS-REFERENCE TO RELATED APPLICATION

The priority of Korean patent application No. 10-2008-088764 filed on Sep. 9, 2008, the disclosure of which is hereby incorporated in its entirety by reference, is claimed.

BACKGROUND OF THE INVENTION

The present invention relates to a method for manufacturing a semiconductor device, and more particularly, to a method for forming a contact of a semiconductor device.

Recently, as a semiconductor device is highly integrated, the distance between lines, or Critical Dimension (CD), of device becomes narrow. Accordingly, the size of a contact hole necessary for forming a landing plug or a storage node contact plug also becomes smaller. Narrow CD increases resistance of a device, especially, contact resistance which impairs operational performance.

BRIEF SUMMARY OF THE INVENTION

Various embodiments are directed to reduce contact resistance of a landing plug by forming the landing plug in such a manner that a polysilicon layer is deposited on the surface of a landing plug contact hole, and a metal layer is provided in a space defined therein in the process of forming a storage node contact or a bit line contact.

According to an embodiment of the present invention, a method for manufacturing a semiconductor device comprises: preparing a semiconductor substrate in which a landing plug contact hole is formed; forming a landing plug on the surface of the landing plug contact hole; and forming a storage node contact which fills in the landing plug contact hole.

Preferably, the formation of the landing plug contact hole comprises: forming a gate on the semiconductor substrate upper; forming a first insulating layer which fills in a gap between the gates; and etching the first insulating layer by a photolithographic etching process using a landing plug contact mask.

Preferably, the landing plug is formed with a polysilicon layer.

Preferably, the method further comprises forming a second insulating layer which fills in the landing plug contact hole in the upper portion of the landing plug.

Preferably, the second insulating layer is formed with an oxide layer.

Preferably, forming a storage node contact comprises: forming a third insulating layer in the upper portion of an entire surface; forming a storage node contact hole which exposes the landing plug by etching the third and the second insulating layer by a photolithographic etching process using a storage node contact mask; and filling in a conductive layer in the storage node contact hole.

Preferably, the conductive layer is formed with a tungsten (W) layer.

The present invention provides an effect of reducing the contact resistance of the landing plug by forming the landing plug in such a manner that the polysilicon layer is deposited only on the surface of the landing plug contact hole, and the metal layer is buried in the rest of the landing plug contact hole in the process of forming a storage node contact or a bit line contact.

DESCRIPTION OF EMBODIMENTS

Hereinafter, an embodiment of the present invention will be illustrated in detail with reference to the attached drawings.

FIGS. 1a to 1i are cross-sectional diagrams illustrating a method for manufacturing a semiconductor device.

Figure 1A:
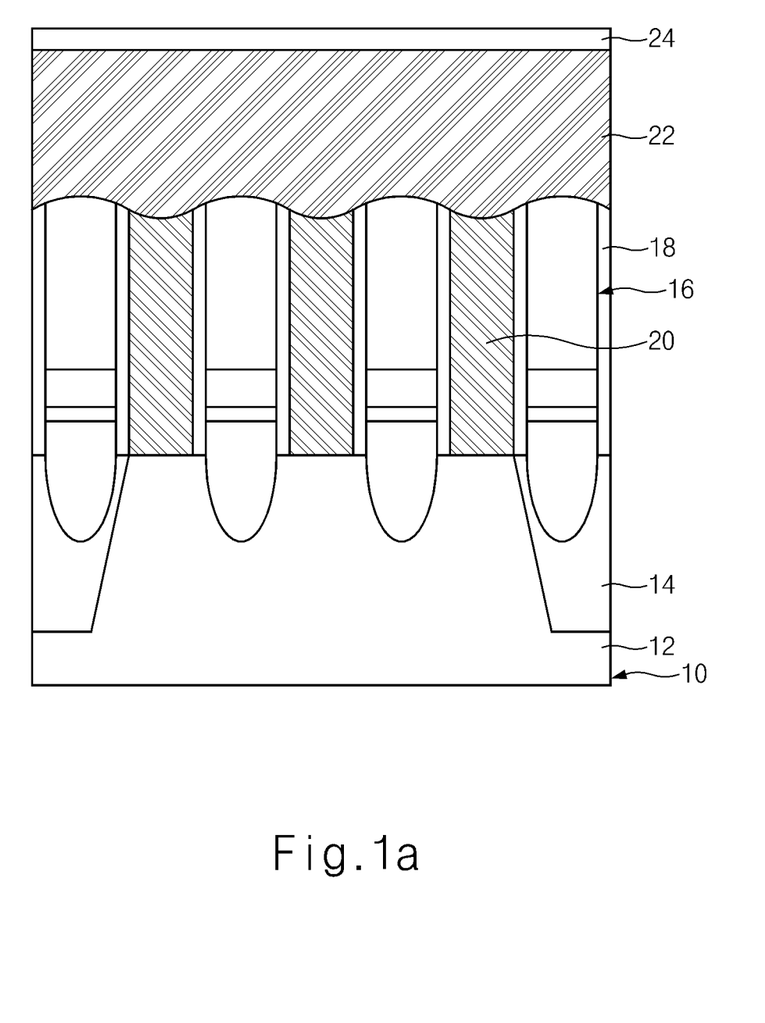
FIGS. 1a to 1i are cross-sectional diagrams illustrating a method for manufacturing a semiconductor device.

Referring to FIG. 1a, an isolation layer 14 which defines an active region 12 is formed on a semiconductor substrate 10. The semiconductor substrate 10 is etched by a photolithographic etching process using a mask (not shown) which defines a gate region to form a recess (not shown).

A gate 16 is formed over the recess. Then, a nitride layer (not shown) is formed over the gate 16 and the semiconductor substrate 10. A spacer 18 is formed on the side wall of the gate 16 by etching back the nitride layer.

A first insulating layer 20 is formed on the semiconductor substrate 10 including the gate 16 and the spacer 18. The first insulating layer 20 is planarized until the gate 16 is exposed.

A first hard mask layer 22 and a first antireflection layer 24 are formed over the first insulating layer 20, the gate 16 and the spacer 18, subsequently. It is preferable that the first hard mask layer 22 is formed of an amorphous carbon layer, while the first antireflection layer 24 is formed of a SiON layer.

Figure 1B:
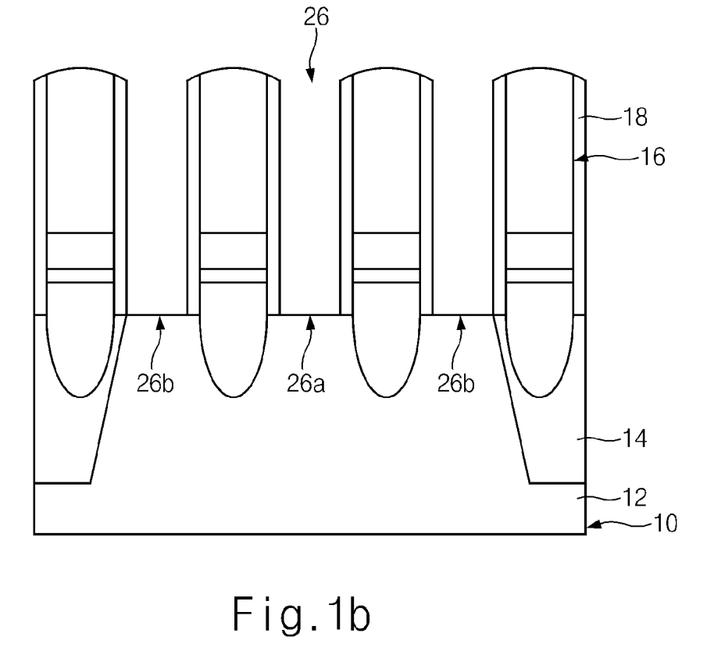

Referring to FIG. 1b, the first antireflection layer 24 and the first hard mask layer 22 are etched by a photolithographic etching process using a mask defining a landing plug (not shown), so that a first antireflection pattern (not shown) and a first hard mask layer pattern (not shown) are formed.

Then, a landing plug contact hole 26 which exposes a bit line contact reserved region 26a and a storage node contact reserved region 26b by etching the first insulating layer 20 with the first antireflection pattern and the first hard mask layer pattern as an etching mask.

Then, the first antireflection pattern and the first hard mask layer pattern are removed.

Figure 1C:
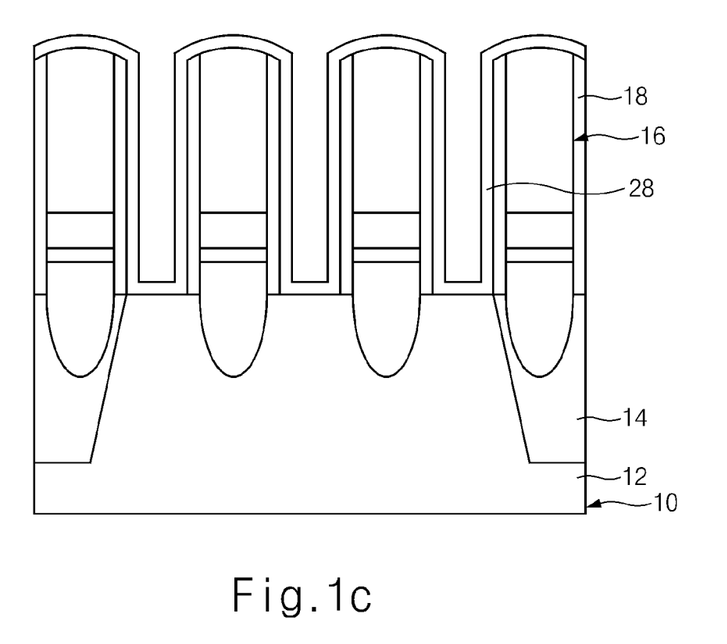
Figure 1D:
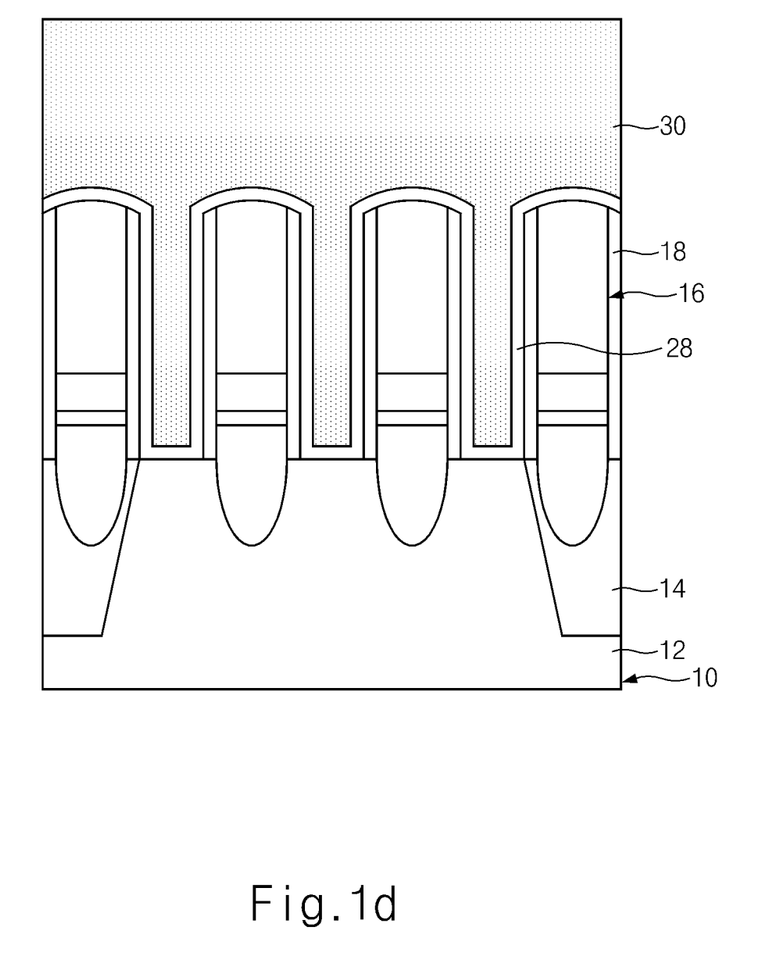
Figure 1E:
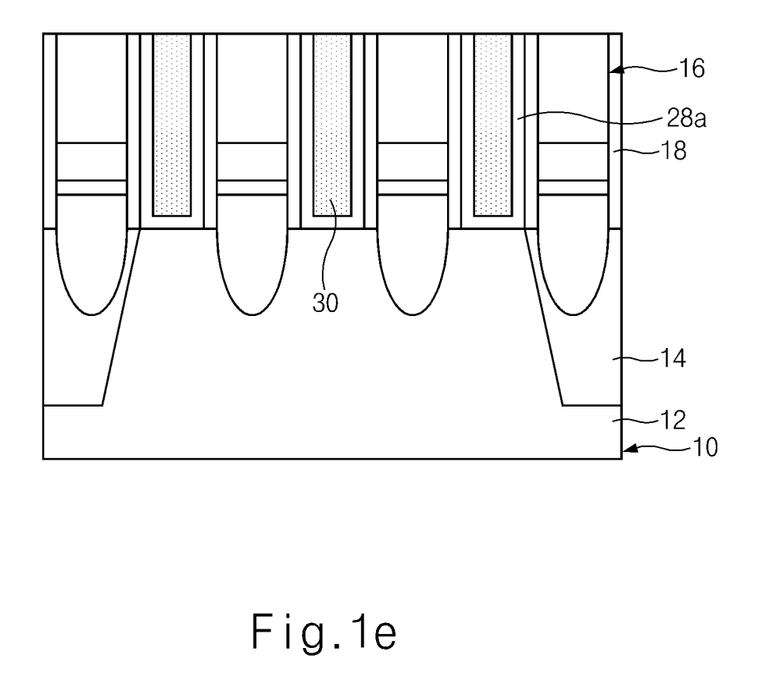

Referring to FIGS. 1c to 1e, a first conductive layer 28 is formed on the surface of the landing plug contact hole 26 and the gate 16. It is preferable that the first conductive layer 28 is formed of a polysilicon layer.

A second insulating layer 30 filling in the landing plug contact hole 26 is formed in the upper portion of the first conductive layer 28. It is preferable that the second insulating layer 30 is formed of an oxide layer.

A landing plug 28a is formed by planarizing the second insulating layer 30 and the first conductive layer 28 until the gate 16 is exposed. It is preferable that the planarization process onto the first conductive layer 28 and the second insulating layer 30 is performed by an etch-back method or a chemical mechanical polishing (CMP) method.

Figure 1F:
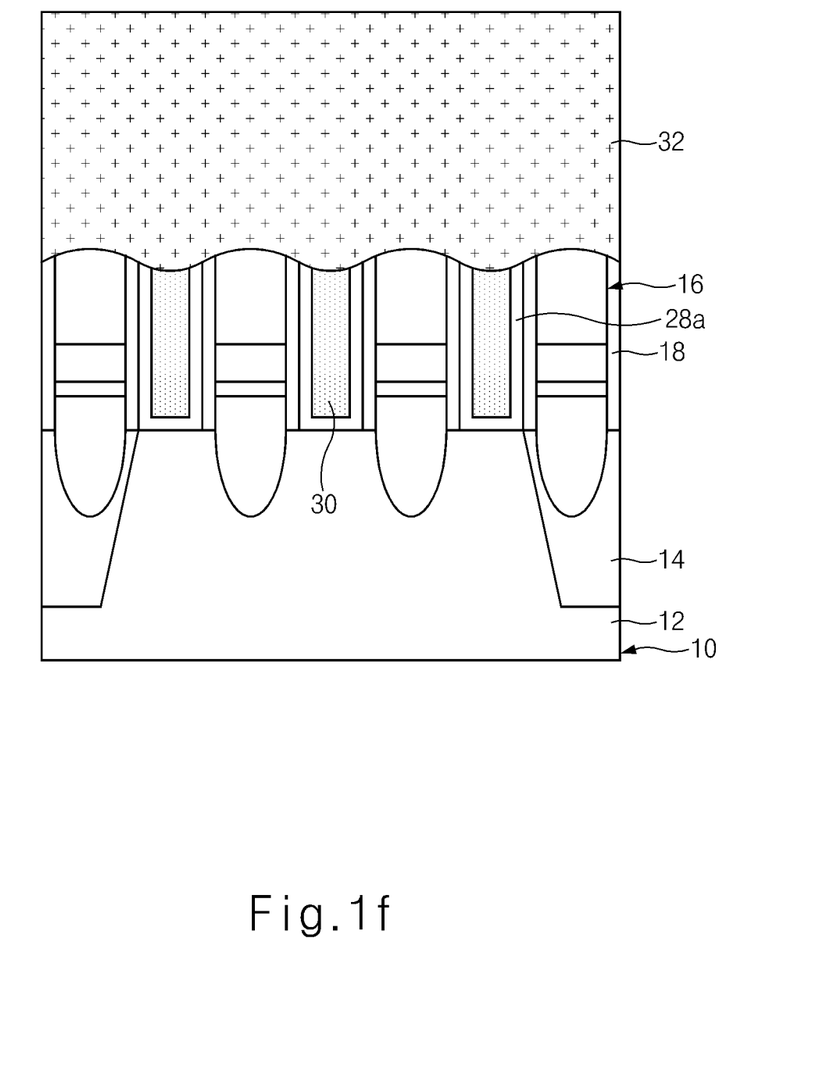
Figure 1G:
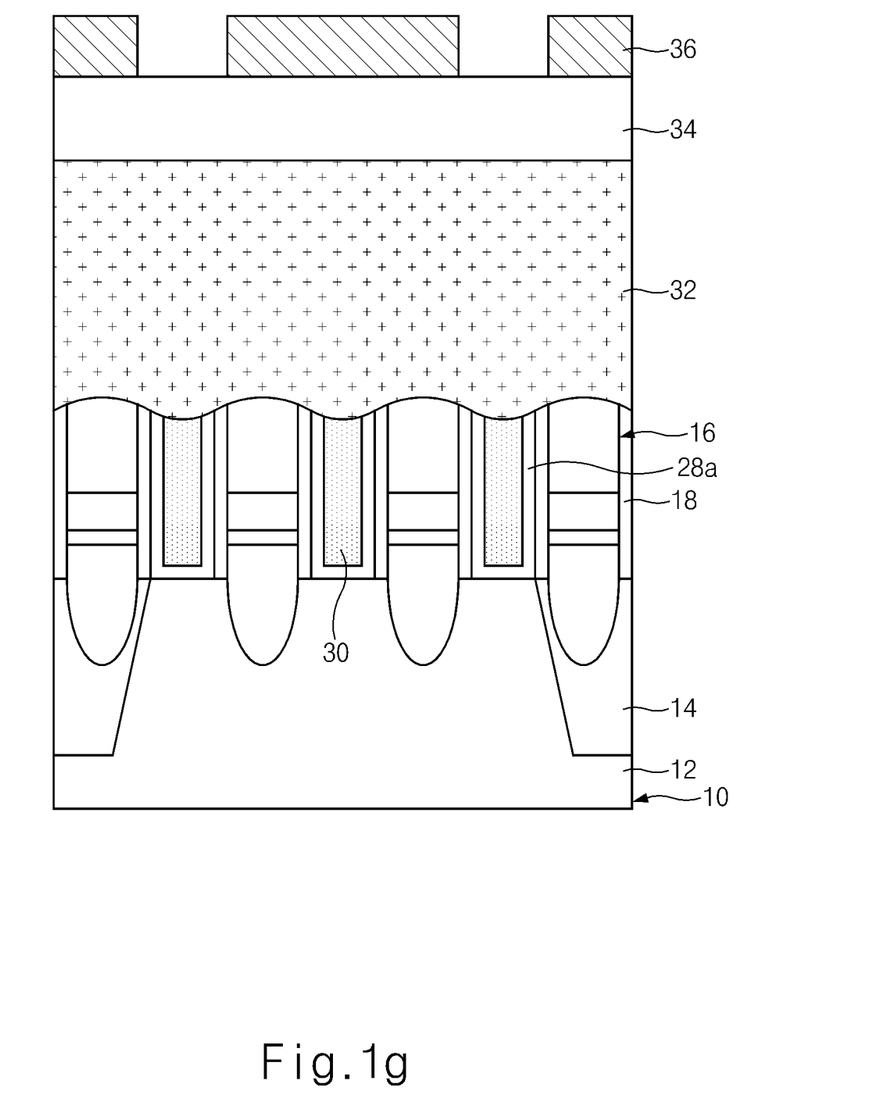

Referring to FIGS. 1f and 1g, a third insulating layer 32 is formed on the landing plug 28a and the second insulating layer 30. A second hard mask layer 34, a second antireflection layer (not shown) and a photoresist layer (not shown) are formed on the third insulating layer 32. A photoresist pattern 36 is formed by exposing and developing the photoresist layer with a storage node contact mask (not shown).

Figure 1H:
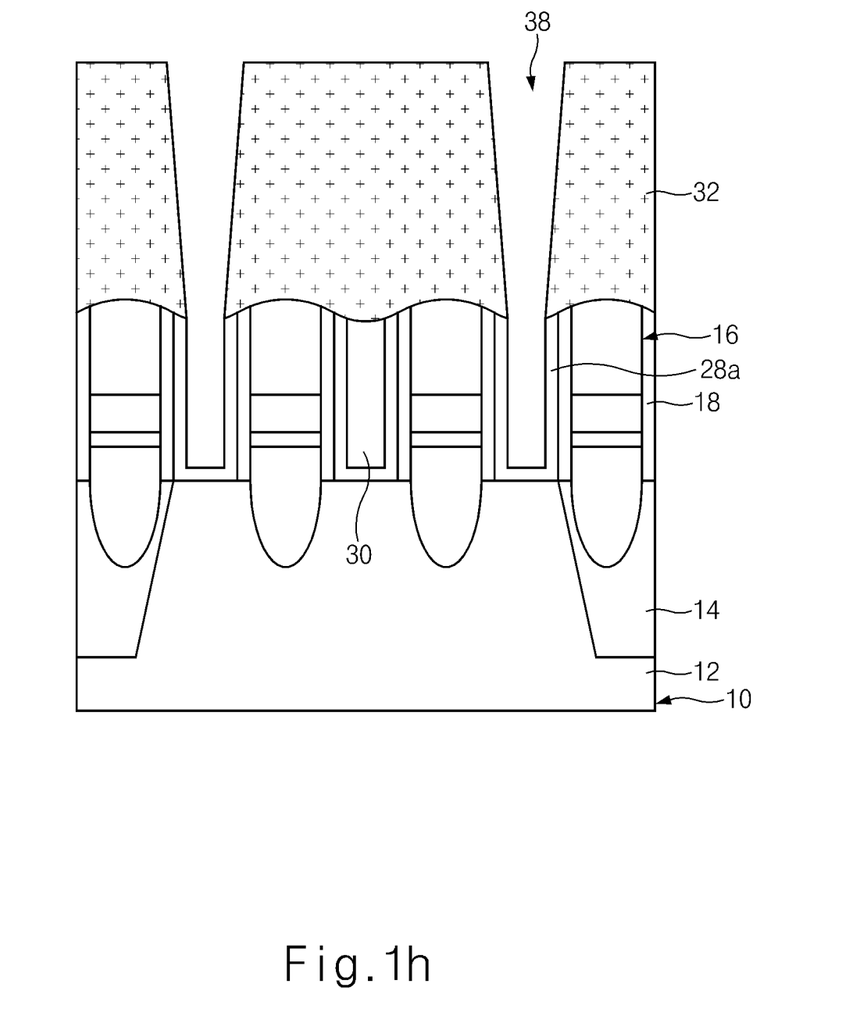

Referring to FIG. 1h, the second antireflection layer and the second hard mask layer 34 are etched using the photoresist pattern 36 as an etching mask so that a second antireflection pattern (not shown) and a second hard mask layer pattern (not shown) are formed.

The third insulating layer 32 and the second insulating layer 30 are etched using the photoresist pattern 36, the second antireflection pattern and the second hard mask layer pattern as an etching mask so that a storage node contact hole 38 which exposes the landing plug 28a is formed.

Then, the photoresist pattern 36, and the second antireflection pattern and the second hard mask layer pattern are removed.

Figure 1I:
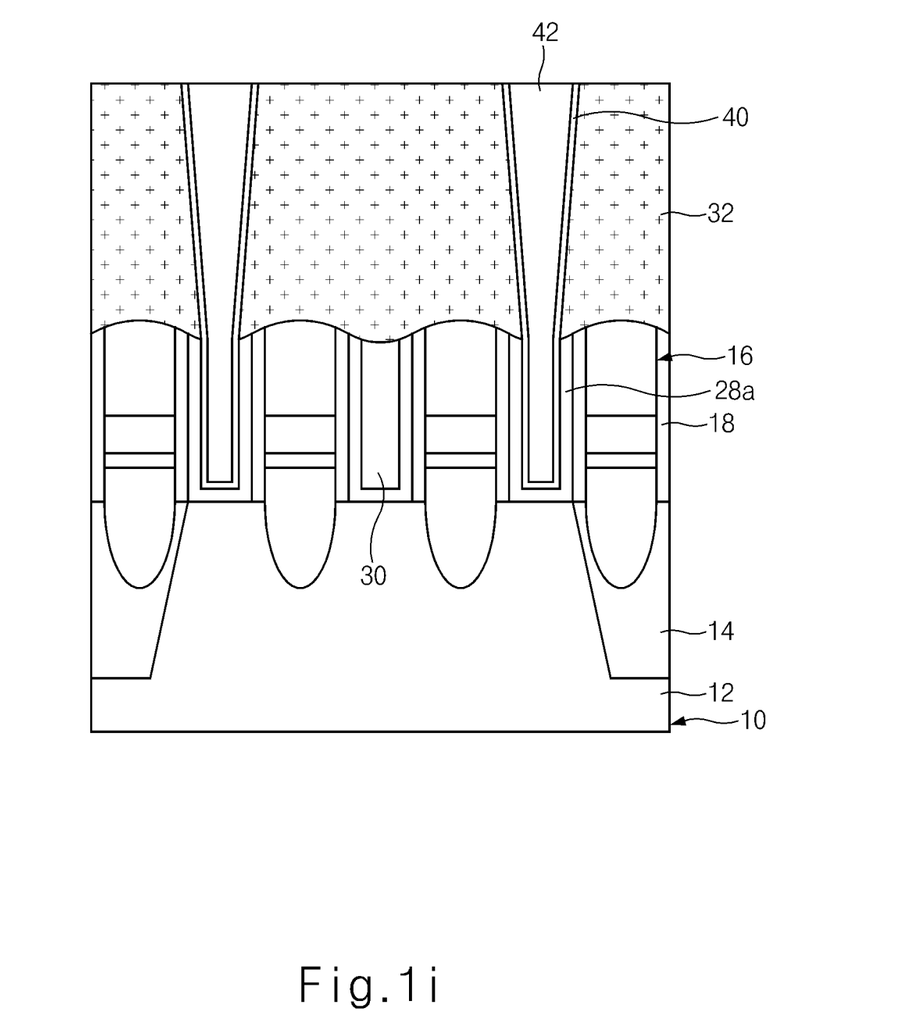

Referring to FIG. 1i, a barrier metal layer 40 is formed on the surface of the storage node contact hole 38, and a second conductive layer (not shown) is formed on the barrier metal layer 40 and the third insulating layer 32.

It is preferable that the barrier metal layer 40 is formed of a stack structure of a titanium Ti layer and a titanium nitride (TIN) layer. It is preferable that the second conductive layer is formed of a tungsten (W) layer.

A storage node contact 42 is formed by planarizing the barrier metal layer until the third insulating layer 32 is exposed.

That is, in the present embodiment, a polysilicon layer is coated on the sidewall of the landing plug contact hole, e.g., on the sidewall of the landing plug contact hole. In one embodiment, the polysilicon layer is formed on the bottom of the landing plug contact hole to a given depth, so that a landing plug will comprise a lower portion substantially made of polysilicon and an upper portion substantially made of tungsten. The contact resistance can be reduced by forming the metal layer having a resistance lower than the polysilicon layer, for example, the tungsten layer filling in the landing plug contact hole during the process of forming a storage node contact.

According to the embodiment of the present invention, the landing plug serving as a storage node contact plug is formed of a metal layer. However, this invention is not limitative thereto, and a landing plug serving as a bit line contact plug also can be formed serving as a metal layer.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory DRAM device or non volatile memory device. Other additions, subtractions, or modifications are obvious in view of the present disclosure and are intended to fall within the scope of the appended claims.

What is claimed is:

1. A semiconductor device comprising:
   first, second, and third gate each extending into a substrate;
   a first landing plug contact hole exposing the substrate between the first and the second gates and a second landing plug contact hole exposing the substrate between the second and the third gates, the first landing plug contact hole being formed in a bit line contact region and the second landing plug contact hole being formed in a storage node contact region;
   a first conductive layer formed over sidewalls of the first and the second landing plug contact holes, the first conductive layer being formed conformal to the first and the second landing plug contact holes;
   a storage node contact hole having a bottom opening joined to a top opening of the second landing plug contact hole; and
   a second conductive layer formed in the storage node contact hole and the second landing plug contact hole to form a storage node contact plug and a landing plug, respectively, the second conductive layer having a higher conductivity than the first conductive layer.

2. The device according to claim 1, wherein the first conductive layer includes polysilicon and the second conductive layer includes metal.

3. The device of claim 1, wherein the first conductive layer extends no higher than the top opening of the landing plug contact hole.

4. The device according to claim 1, wherein the second conductive layer includes tungsten.

5. A semiconductor device comprising:
   first, second, and third gates each extending into a substrate;
   a first landing plug contact hole exposing the substrate between the first and the second gates and a second landing plug contact hole exposing the substrate between the second and the third gates, the first landing plug contact hole being formed in a bit line contact region and the second landing plug contact hole being formed in a storage node contact region;
   a first conductive layer formed at the bottom of the first and the second landing plug contact holes;
   a storage node contact hole having a bottom opening joined to a top opening of the second landing plug contact hole; and
   a second conductive layer in the storage node contact hole and the second landing plug contact hole to form a storage node contact plug and a landing plug, the second conductive layer having a higher conductivity than the first conductive layer.

6. The device according to claim 5, wherein the first conductive layer includes polysilicon and the second conductive layer includes metal.

7. The device of claim 5, wherein the first conductive layer extends no higher than the top opening of the landing plug contact hole.

8. The device according to claim 5, wherein the second conductive layer includes tungsten.

* * * * *